(12) United States Patent
Abe et al.

(10) Patent No.: US 9,281,470 B2
(45) Date of Patent: Mar. 8, 2016

(54) PLASMA PROCESSING METHOD

(71) Applicant: Hitachi High-Technologies Corporation, Minato-ku, Tokyo (JP)

(72) Inventors: Takahiro Abe, Tokyo (JP); Naohiro Yamamoto, Tokyo (JP); Makoto Suyama, Tokyo (JP); Masato Ishimaru, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/447,614

(22) Filed: Jul. 31, 2014

(65) Prior Publication Data

US 2015/0349245 A1 Dec. 3, 2015

(30) Foreign Application Priority Data

May 30, 2014 (JP) .................................. 2014-111876

(51) Int. Cl.
*H01L 43/12* (2006.01)

(52) U.S. Cl.
CPC ....................................... *H01L 43/12* (2013.01)

(58) Field of Classification Search
None
See application file for complete search history.

(56) References Cited

U.S. PATENT DOCUMENTS

| | | | |
|---|---|---|---|
| 8,728,946 B1* | 5/2014 | Abe et al. | 438/706 |
| 2013/0048599 A1* | 2/2013 | Satake et al. | 216/22 |
| 2013/0146563 A1* | 6/2013 | Abe et al. | 216/22 |
| 2014/0144873 A1* | 5/2014 | Yoshida et al. | 216/22 |
| 2015/0017741 A1* | 1/2015 | Fujita et al. | 438/3 |

FOREIGN PATENT DOCUMENTS

| | | |
|---|---|---|
| JP | 08-335571 A | 12/1996 |
| JP | 09-045756 A | 2/1997 |
| JP | 2003-243362 A | 8/2003 |

* cited by examiner

*Primary Examiner* — Allan Olsen
(74) *Attorney, Agent, or Firm* — Miles & Stockbridge P.C.

(57) ABSTRACT

In a plasma processing method for plasma-etching magnetic layer by using a plasma processing device including a processing chamber in which a sample is plasma-processed, a dielectric window to seal an upper part of the processing chamber hermetically, an inductive coupling antenna disposed above the dielectric window, a radio-frequency power source to supply radio-frequency electric power to the inductive coupling antenna and a Faraday shield disposed between the inductive coupling antenna and the dielectric window, a deposit layer is formed on the plasma-etched magnetic layer by plasma processing while applying radio-frequency voltage to the Faraday shield after the magnetic layer is plasma-etched.

4 Claims, 7 Drawing Sheets

| STEP | GAS FLOW RATE (ml/min) | | S-RF POWER (W) | B-RF POWER (W) | FSV (V) | PRESSURE (Pa) | ELECTRODE TEMPERATURE (°C) | PROCESSING TIME (s) |
|---|---|---|---|---|---|---|---|---|
| 1 | Ar | NH3 | 2400 | 200 | 100 | 0.5 | 100 | 100 |
| | 20 | 60 | | | | | | |
| 2 | Ar | | 2000 | 0 | 1500 | 0.5 | 100 | 350 |
| | 100 | | | | | | | |

| STEP | GAS FLOW RATE (ml/min) | | S-RF POWER (W) | B-RF POWER (W) | FSV (V) | PRESSURE (Pa) | ELECTRODE TEMPERATURE (°C) | PROCESSING TIME (s) |
|---|---|---|---|---|---|---|---|---|
| 1 | Ar 20 | NH3 60 | 2400 | 200 | 100 | 0.5 | 100 | 100 |
| 2 | Ar 100 | | 2000 | 0 | 1500 | 0.5 | 100 | 350 |

FIG.13B

| GAS FLOW RATE (ml/min) | | S-RF POWER (W) | B-RF POWER (W) | FSV (V) | PRESSURE (Pa) | ELECTRODE TEMPERATURE (°C) | PROCESSING TIME (s) |
|---|---|---|---|---|---|---|---|
| Ar 60 | O₂ 20 | 2000 | 0 | 1000 | 0.5 | 100 | 200 |

PLASMA PROCESSING METHOD

BACKGROUND OF THE INVENTION

The present invention relates to a plasma processing method for plasma-etching magnetic film (or magnetic layer) material.

In magnetic storage devices, high recording density is increased every year and reproducing heads are also required to cope with high recording density. In order to meet the requirements, Current-in-Plane-Giant Magneto-Resistance (CIP-GMR) sensors in which current is sent in a film (or layer) surface of a magnetoresistance effect film (or layer) including a thin nonmagnetic layer disposed between two kinds of ferromagnetic layers have been developed and are applied as the reproducing heads.

At present, the reproducing heads are being shifted to Tunneling Magneto-Resistive (TMR and hereinafter referred to as TMR) heads and Current Perpendicular to the Plane-Giant Magneto-resistance (CPP-GMR) heads used by sending current in a layer thickness direction of a lamination layer. In order to increase the reproduced output, it is general to enhance the MR (Magneto-Resistive) ratio and at present TMR heads having the highest MR ratio are widely adopted.

Further, in the manufacturing process of the TMR heads, an etching process and a layer formation process of magnetic material used as material of TMR elements are also one important research and development and various processes and plasma processing devices are subjected to research and development.

Figure 1:
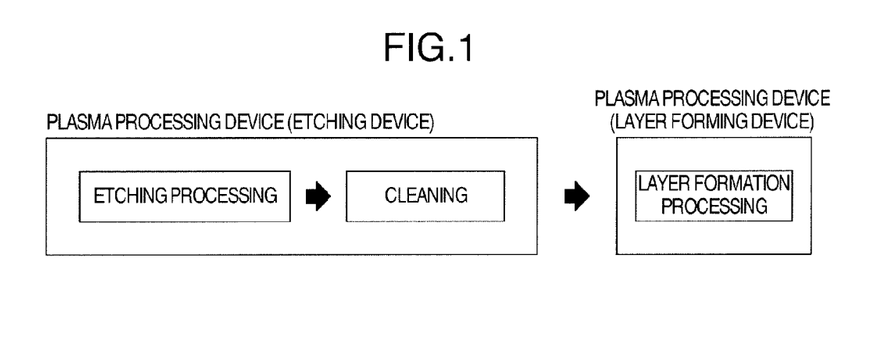
FIG. 1 is a diagram illustrating a flow of the etching processing and the layer formation processing in a prior art.

Under the present circumstances, the etching process and the layer formation process of magnetic material in the manufacturing process of devices such as TMR elements employ separate plasma processing devices as shown in FIG. 1. Further, when a sample is conveyed to a layer formation processing device after the etching processing, there arises a problem that the devices are deteriorated due to contaminants or useless contaminating matters attached to the surface of the sample. Accordingly, in order to prevent the deterioration of devices due to the contaminants or useless contaminating matters, cleaning processing is performed to the devices after the etching processing and thereafter the layer formation processing device is used to perform layer formation processing.

For example, JP-A-8-335571 discloses cleaning processing measures using an etching treatment apparatus in which etching means 10, ashing means 20, rinsing means 30 and drying means 40 are disposed within the apparatus of one unit and specimens taken out one by one from a cassette are sequentially treated by using each means and which includes control means for storing the treated specimens in the cassette, although it is necessary to spend enormous investment in plant and equipment and enormous manufacturing time in the device manufacturing process. Accordingly, it is necessary to perform the etching processing and the layer formation processing in the same apparatus or the same vacuum chamber.

For example, as a semiconductor manufacturing device capable of performing a plurality of treatments by a single device in a thin film (or layer) formation process and capable of manufacturing semiconductor elements with high quality, JP-A-2003-243362 discloses a semiconductor manufacturing device which includes a vacuum container, an insulation dielectric disposed in the vacuum container and having an electrode plate disposed on one surface and a wafer disposed on the other surface, voltage application means for applying voltage between the electrode plate and the wafer and heating means for heating the wafer and in which the voltage application means applies the voltage to thereby generate electrostatic suction force between the electrode plate and the wafer so that the wafer is sucked to be held on the surface of the insulation dielectric and the wafer is subjected to processing for manufacturing of the semiconductor elements, the semiconductor manufacturing device being characterized in that the insulation dielectric has a value of volume resistivity $\rho$ falling within the range of $108\Omega$ cm$<\rho<1013\Omega$ cm in a heating temperature range for forming thin film (or layer). However, since the plasma processing device as disclosed in JP-A-2003-243362 is supposed as the plasma processing device which performs two treatments of the etching processing and the layer formation processing, it is difficult to apply measures disclosed in JP-A-9-45756 as it is.

Further, JP-A-2003-243362 discloses an etching method for suppressing adhesion of a reaction product to an inner wall of a vacuum container and a cleaning method for efficiently removing the adhered reaction product in a plasma processing device for processing nonvolatile material by using a Faraday shield.

SUMMARY OF THE INVENTION

However, JP-A-2003-243362 gives neither disclosure nor suggestion about the technical idea for performing both of the etching processing and the layer formation processing in a signal processing chamber.

Accordingly, it is an object of the present invention to provide a plasma processing method using an inductive coupling type plasma etching device provided with a Faraday shield and capable of performing both of etching processing and layer formation processing of magnetic layer in a single processing chamber.

According to the present invention, in the plasma processing method for plasma-etching magnetic layer by using a plasma processing device including a processing chamber for plasma-processing a sample, a dielectric window for hermetically sealing upper part of the processing chamber, an inductive coupling antenna disposed above the dielectric window, a radio-frequency power source for supplying radio-frequency electric power to the inductive coupling antenna and a Faraday shield disposed between the inductive coupling antenna and the dielectric window, a deposit layer is formed on the plasma-etched magnetic layer by plasma etching while radio-frequency voltage is applied to the Faraday shield after the magnetic layer is plasma-etched.

According to the present invention, in the plasma processing method using the inductive coupling type plasma etching device having the Faraday shield, both of the etching processing and the layer formation processing of the magnetic layer can be performed in the single processing chamber.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention are now described in detail with reference to the accompanying drawings.

Embodiment 1

Figure 2:
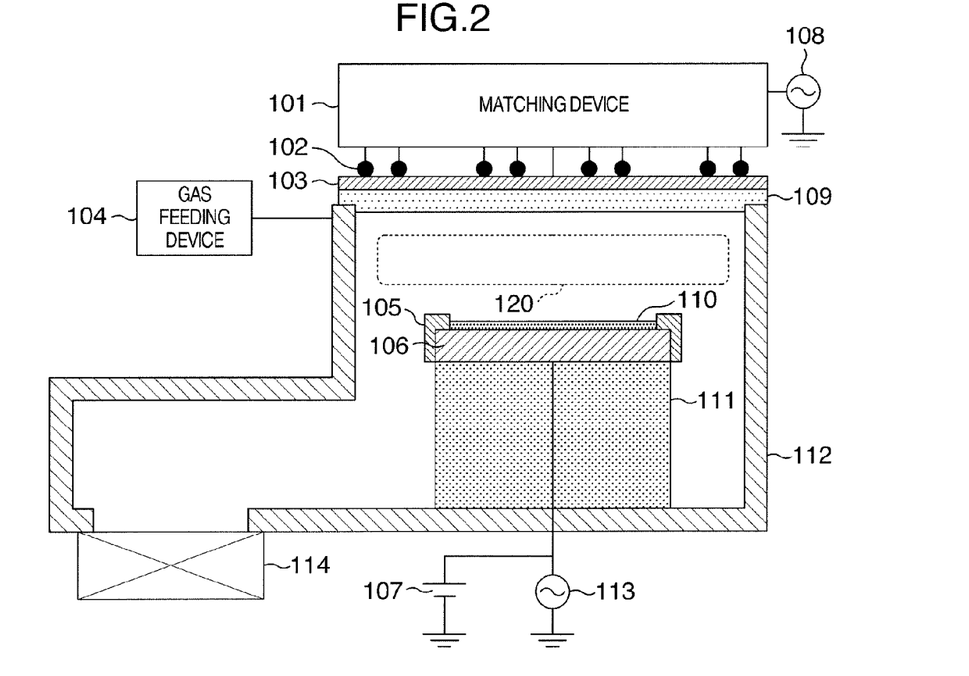
FIG. 2 is a sectional view schematically illustrating a plasma processing device according to the present invention.

A first embodiment of the present invention is described with reference to the accompanying drawings. FIG. 2 is a sectional view schematically illustrating a plasma etching device used when the plasma processing method according to the present invention is performed.

A plasma processing chamber is composed of an inner wall 112 and a window 109. The window 109 which is a dielectric window is formed of a flat dielectric and is opposite to a sample stage on which a sample is put. In the embodiment, the window 109 is made of alumina ($Al_2O_3$). The inside of the plasma processing chamber is exhausted by an exhaust device 114 to be evacuated into high vacuum state. Gases used in plasma processing are fed from a gas feeding device 104 into the plasma processing chamber. Inductive coupling antennas 102 for generating an induced magnetic field are disposed above the window 109 and are supplied with radio-frequency electric power from a first radio-frequency power source 108. Further, the inductive coupling antennas 102 are composed of an inside inductive coupling antenna and an outside inductive coupling antenna.

Moreover, a Faraday shield 103 is disposed between the inductive coupling antennas 102 and the window 109. Further, the Faraday shield 103 is an antenna which is capacitively coupled with plasma and is applied with radio-frequency voltage from the first radio-frequency power source 108 through a matching device 101. Furthermore, the radio-frequency voltage is applied to the Faraday shield 103 to thereby make it possible to remove reaction products attached to the window 109. Plasma is generated in the plasma processing chamber by the induced magnetic field generated by the inductive coupling antennas 102 and gases fed from the gas feeding device 104.

The sample 110 to be subjected to the etching processing and the layer formation processing is put on the sample stage 106 which is a mounting plane and the sample stage 106 is fed with radio-frequency electric power from a second radio-frequency power source 113. Thus, ions in plasma 120 are brought into the sample 110 to thereby advance plasma etching. Further, the sample 110 is electrostatically absorbed to the sample stage 106 by applying DC voltage to the sample stage 106 from a DC voltage power source 107. Further, a susceptor 105 is part for controlling distribution in sheath generated on the sample stage 106 and an electrode cover 111 functions as a protection cover for preventing a mechanism within the sample stage 106 from being exposed to plasma.

Figure 3:
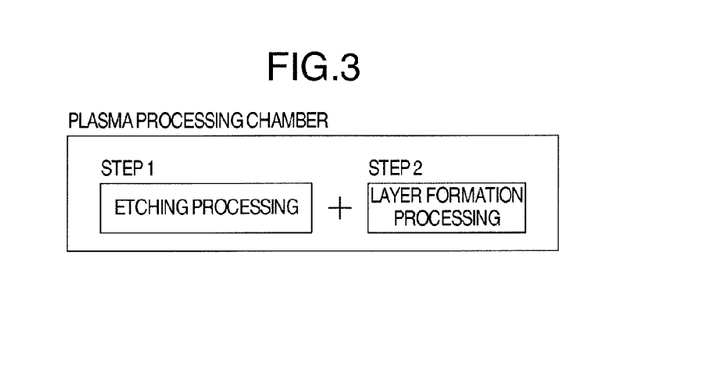
FIG. 3 is a diagram illustrating a plasma processing method according to the present invention.
Figure 4:
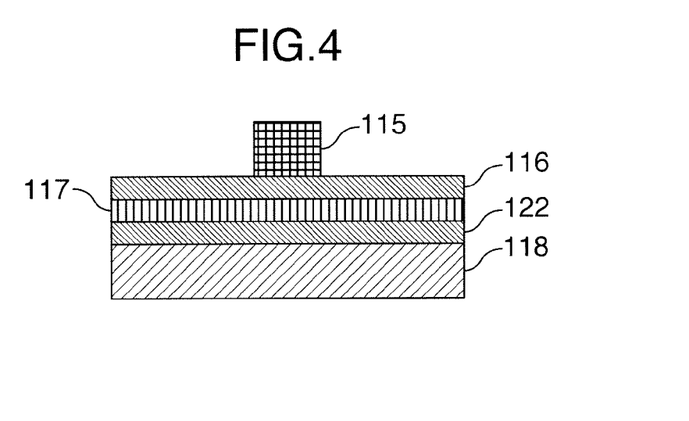
FIG. 4 is a diagram showing a device structure of a TMR element.

Next, the plasma processing method according to the present invention is described with reference to FIG. 3. In the present invention, the etching processing and the layer formation processing can be performed successively in the single plasma processing chamber as shown in FIG. 3. Further, the sample to be subjected to the plasma processing method according to the present invention has a device sample structure of a TMR element as shown in FIG. 4 and includes a tantalum (Ta) layer 115 having a thickness of about 50 nm, an upper cobalt iron boron (CoFeB) layer 116, a magnesium oxide (MgO) layer 117 and a lower cobalt iron boron (CoFeB) layer 122 piled up on a silicon substrate 118 successively in order of description from above. Moreover, a thickness of the upper cobalt iron boron (CoFeB) layer 116, the magnesium oxide (MgO) layer 117 and the lower cobalt iron boron (CoFeB) layer 122 is about 1 to 2 nm.

Figure 5:
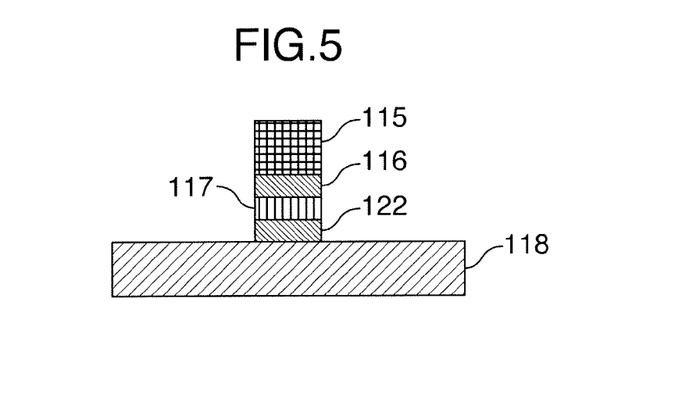
FIG. 5 is a diagram showing an etch profile after the etching processing in the plasma processing method of the present invention.
Figure 13A:
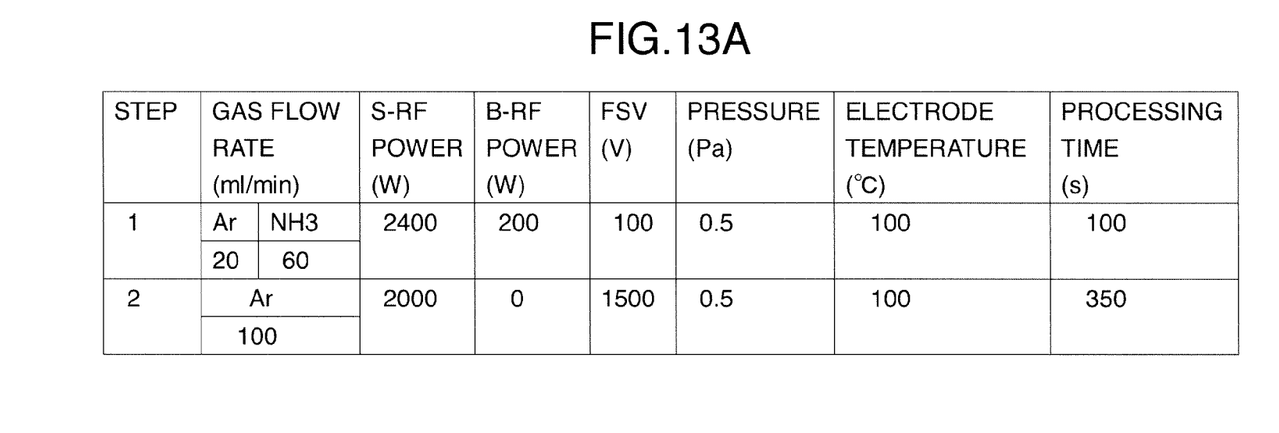
FIGS. 13A and 13B are tables showing etching conditions in the first and second embodiments according to the present invention, respectively.

First, in a step 1 (etching processing) shown in FIG. 3, the etching processing is performed under the conditions described in step 1 of FIG. 13A. Concretely, mixture gases of ammonia (NH3) gases of 60 ml/min and argon (Ar) gases of 20 ml/min are used to subject the upper cobalt iron boron (CoFeB) layer 116, the magnesium oxide (MgO) layer 117 and the lower cobalt iron boron (CoFeB) layer 122 to plasma etching under the conditions of processing pressure set to 0.5 Pa, output (S-RF power) of the first radio-frequency power source 108 set to 2400 W, output (B-RF power) of the second radio-frequency power source 113 set to 200 W, radio-frequency voltage (FSV) applied to the Faraday shield 103 set to 100V, electrode temperature set to 100° C. and the processing time set to 100 s while using the tantalum (Ta) layer 115 as a mask. As a result of the plasma etching, an etch profile as shown in FIG. 5 is obtained.

Further, this plasma etching conditions have large selectivity of the upper cobalt iron boron (CoFeB) layer 116, the magnesium oxide (MgO) layer 117 or the lower cobalt iron boron (CoFeB) layer 122 and the tantalum (Ta) layer 115 and are easy to obtain a vertical shape in the etch profile after the etching processing.

Figure 6:
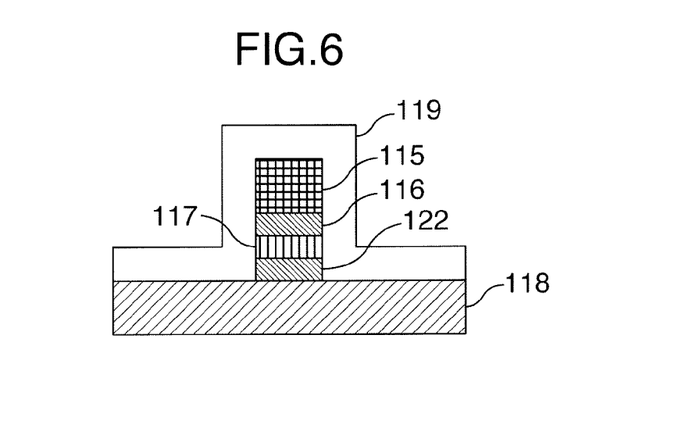
FIG. 6 is a diagram showing an etch profile of layers formed after the layer formation processing in the plasma processing method of the present invention.

Next, the layer formation processing in step 2 shown in FIG. 3 is performed under the conditions described in step 2 of FIG. 13A. Concretely, argon (Ar) gases of 100 ml/min are used to form a deposit layer 119 so as to cover the etch profile formed by etching in step 1 of FIG. 3 as shown in FIG. 6 under the conditions of processing pressure set to 0.5 Pa, output (S-RF power) of the first radio-frequency power source 108 set to 2000 W, output (B-RF power) of the second radio-frequency power source 113 set to 0 W, radio-frequency voltage (FSV) applied to the Faraday shield 103 set to 1500 V, electrode temperature set to 100° C. and the processing time set to 350 s. Further, since the output (B-RF power) of the second radio-frequency power source 113 is set to 0 W, the layer formation processing is accelerated. Moreover, the deposit layer 119 contains alumina ($Al_2O_3$).

The thickness of the formed deposit layer 119 depends on the layer formation processing time and in the embodiment the deposit layer 119 having the thickness of 30 nm is formed.

Further, in the embodiment, since plasma at the time of the layer formation processing is generated using gases having strong sputtering characteristic as rare gases such as argon gases or krypton gases or xenon gases, the window 109 is sputtered efficiently as compared with other gases to form the deposit layer 119 which hardly contains impurities. Furthermore, in order to sputter the window 109 efficiently, it is necessary to increase incident energy of ions on the window 109 and accordingly the radio-frequency voltage applied to the Faraday shield 103 is preferably larger than or equal to 1000V.

As described above, the etching processing and the layer formation processing can be performed successively in the single plasma processing chamber, so that the layer formation processing can be performed before contaminants or useless contaminating matters causing deterioration in devices such as TMR elements are mixed. Accordingly, the cleaning processing shown in FIG. 1 can be omitted. It contributes to reduction in enormous investment in plant and equipment and enormous manufacturing time.

The reason that the layer formation processing can be performed in the plasma processing chamber in which plasma etching is made by the plasma processing of the present invention is considered as follows.

Figure 7:
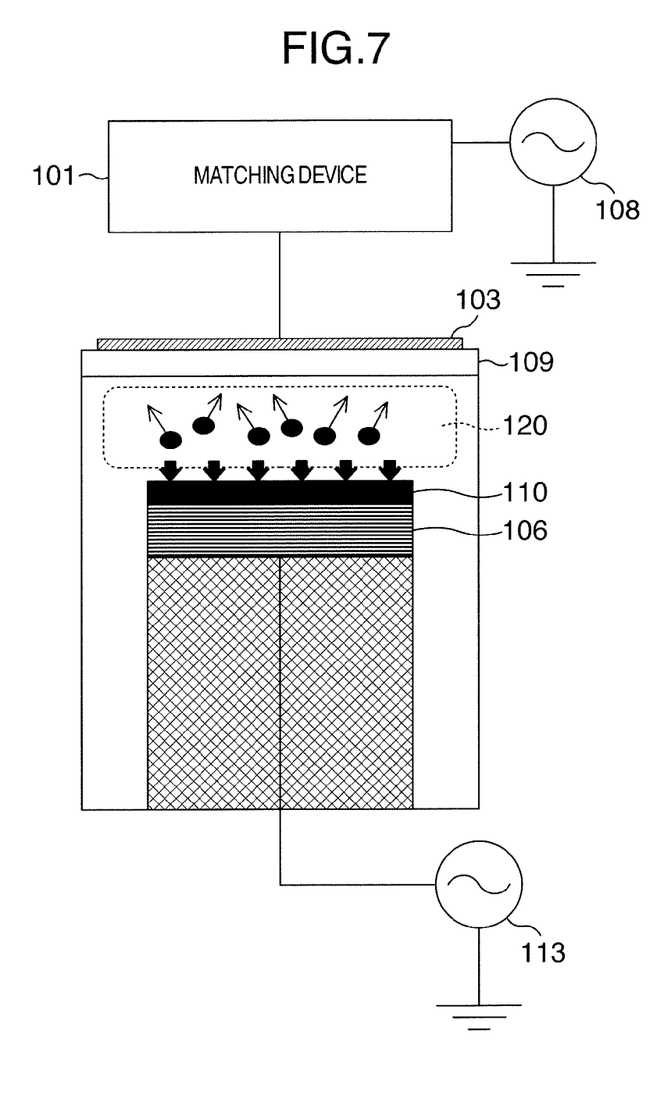
FIG. 7 is a diagram illustrating a state in a plasma processing chamber during the plasma etching processing according to the present invention.

FIG. 7 illustrates the state in the plasma processing chamber during plasma etching processing. As shown in FIG. 7, when the radio-frequency voltage applied to the Faraday shield 103 is 100V, the surface (on the exposed side to plasma) of the window 109 is hardly scraped away by plasma during plasma etching of the upper cobalt iron boron (CoFeB) layer 116, the magnesium oxide (MgO) layer 117 and the lower cobalt iron boron (CoFeB) layer 122. Accordingly, alumina ($Al_2O_3$) is not substantially supplied to vapor phase of plasma from the surface (on the exposed side to plasma) of the window 109.

Figure 8:
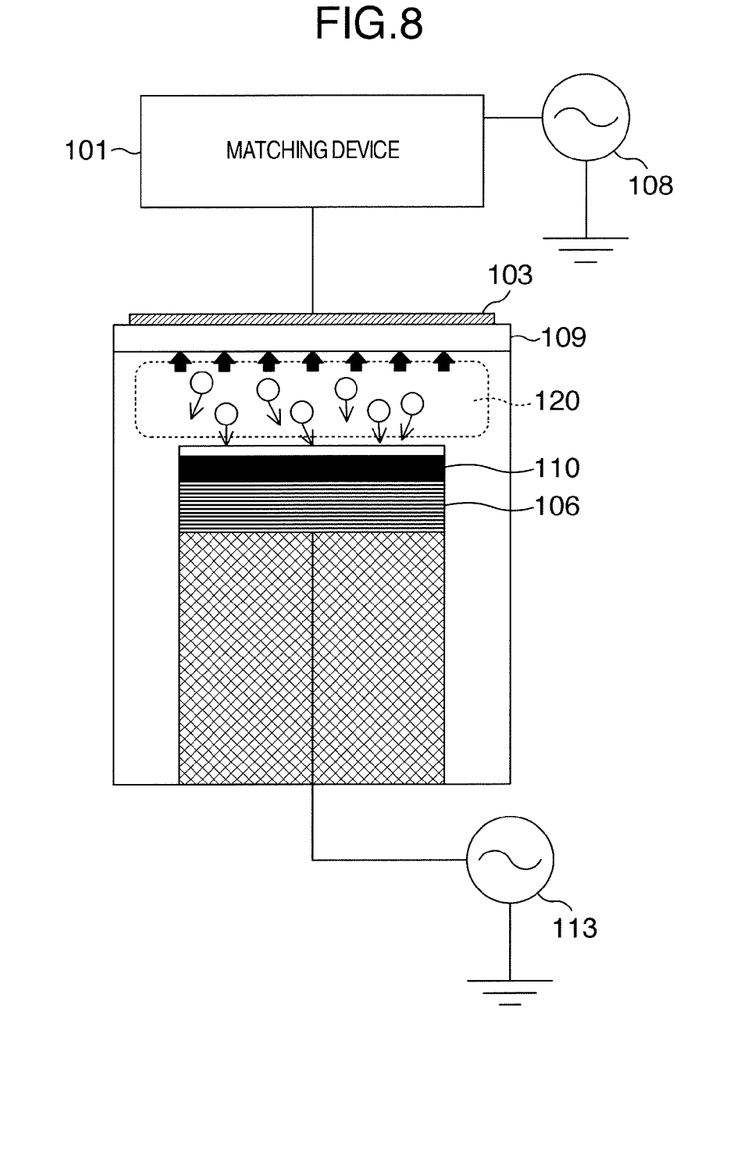
FIG. 8 is a diagram illustrating a state in the plasma processing chamber during the layer formation processing according to the present invention.

On the other hand, in the layer formation processing, since the radio-frequency voltage applied to the Faraday shield 103 is 1500V as shown in FIG. 8, ions in the plasma are incident on the window 109 and alumina ($Al_2O_3$) sputtered by the incident ions is discharged in the vapor phase of plasma. It is considered that the alumina ($Al_2O_3$) discharged in the vapor phase of plasma contributes to the layer formation of the deposit layer 119. Further, FIG. 8 illustrates the state in the plasma processing chamber during the layer formation processing.

In the embodiment, the deposit layer containing alumina ($Al_2O_3$) is formed using the window 109 formed of alumina ($Al_2O_3$), although, for example, when the window formed of silicon oxide layer ($SiO_2$) is used, the deposit layer containing the silicon oxide layer ($SiO_2$) can be formed. That is, when it is desired to form the deposit layer containing a desired component, the window having at least the surface containing the same material as the desired component may be used. Next, an embodiment considering the stability in mass production and the like is described.

Embodiment 2

Figure 9:
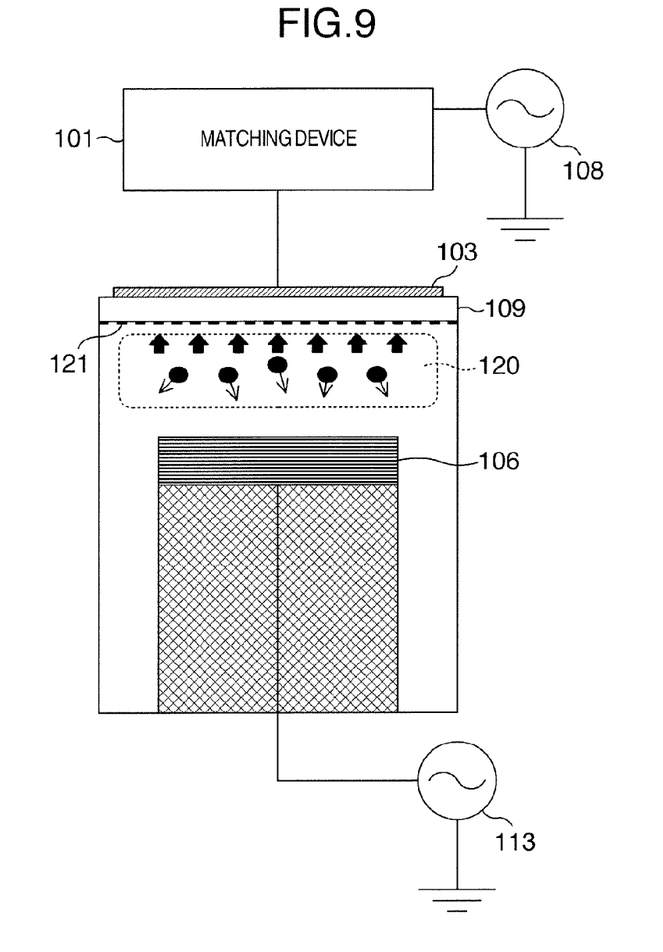
FIG. 9 is a diagram illustrating a state in the plasma processing chamber during plasma cleaning of reaction products attached to a window.

A second embodiment of the present invention is described with reference to FIGS. 9 to 12. When magnetic material forming devices such as TMR elements or the like is subjected to the plasma etching processing for a long time, reaction products 121 of magnetic material are attached to the window 109 as shown in FIG. 9. When the layer formation processing is performed in the state that the reaction products 121 are attached to the window 109, it is apprehended that the quality of the layer formation processing is reduced by mixing impurities in the deposit layer 119.

Accordingly, it is desirable that the sample 110 is once taken out from the plasma processing chamber after the etching processing and the plasma cleaning for removing the reaction products attached to the window 109 while applying the radio-frequency voltage to the Faraday shield 103 as shown in FIG. 9 is performed so that the layer formation processing is performed after the reaction products are removed.

Next, the plasma cleaning conditions are described. As described in FIG. 13B, argon (Ar) gases of 60 ml/min and oxide ($O_2$) gases of 20 ml/min are used to perform the plasma cleaning under the conditions of processing pressure set to 0.5 Pa, output (S-RF power) of the first radio-frequency power source 108 set to 2000 W, output (B-RF power) of the second radio-frequency power source 113 set to 0 W, radio-frequency voltage (FSV) applied to the Faraday shield 103 set to 1000 V, electrode temperature set to 100° C. and the processing time set to 200 s.

In the plasma cleaning, in order to remove the reaction products efficiently, it is necessary to increase the incident energy of ions on the window 109 in the same manner as the conditions of the layer formation processing and accordingly it is desired to make the radio-frequency voltage (FSV) applied to the Faraday shield 103 larger than or equal to 1000V. Further, in the embodiment, the plasma 120 is generated by mixture gases of argon (Ar) gases and oxide ($O_2$) gases which are used frequently in the plasma cleaning and accordingly the reaction products can be removed efficiently.

Figure 10:
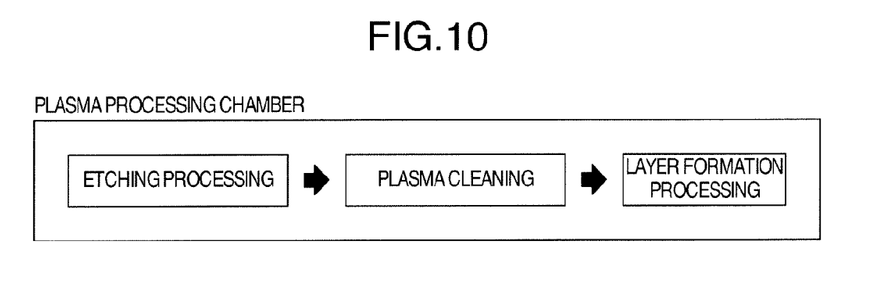
FIG. 10 is a diagram illustrating a plasma processing method according to an embodiment 2.

Next, the plasma processing procedure of the present invention in the embodiment is shown in FIG. 10. After the etching processing, the sample 110 is once taken out from the plasma processing chamber and the reaction products attached to the surface of the window 109 are removed by the plasma cleaning. Thereafter, the sample 110 is taken in the plasma processing chamber again to perform the layer formation processing. Such plasma processing can be performed to thereby suppress impurities from being mixed in the deposit layer 119, so that reduction in quality of the layer formation processing can be prevented.

Figure 11:
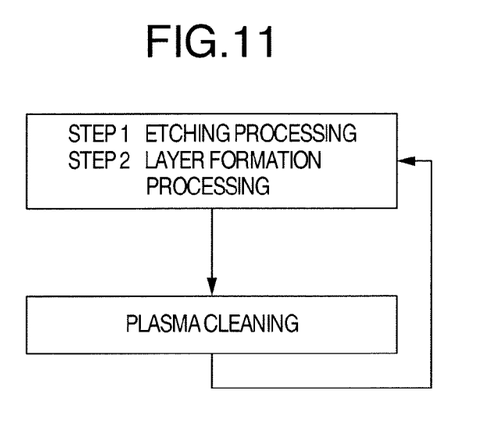
FIG. 11 is a flow chart showing operation of the plasma processing method according to the embodiment 2.

Next, the plasma processing flow in mass production of devices such as TMR elements is shown in FIG. 11. Further, FIG. 11 shows the plasma processing flow in case where the etching time of magnetic material does not extend to a long time. As shown in FIG. 11, the etching processing and the layer formation processing are successively performed in the single plasma processing chamber as steps 1 and 2. After the successive processing in steps 1 and 2, since the inside of the plasma processing chamber is contaminated by the reaction products, the plasma cleaning is performed under the plasma cleaning conditions described in FIG. 13B after each successive processing in steps 1 and 2 and then the processing of device of next TMR element is performed. The mass production of devices such as TMR elements can be performed by such plasma processing flow to thereby maintain the state in the plasma processing chamber to be fixed every time and the etch profile for each device such as TMR element can be suppressed from being scattered, so that the stability in mass production can be improved.

Figure 12:
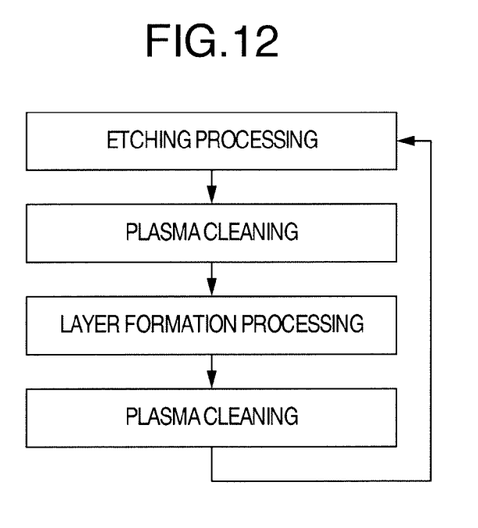
FIG. 12 is a flow chart showing operation of the plasma processing method according to the embodiment 2.

When the etching time of the magnetic material extends to a long time, the reaction products 121 of magnetic material are attached to the window 109 as shown in FIG. 9. The plasma processing flow in the mass production of devices such as TMR elements in this case is shown in FIG. 12. As shown in FIG. 12, after the etching processing, the sample 110 is once taken out from the plasma processing chamber and the reaction products attached to the surface of the window 109 are removed by the plasma cleaning performed under the plasma cleaning conditions described in FIG. 13B. Thereafter, the sample 110 is taken in the plasma processing chamber again and is subjected to the layer formation processing.

Figure 13B:
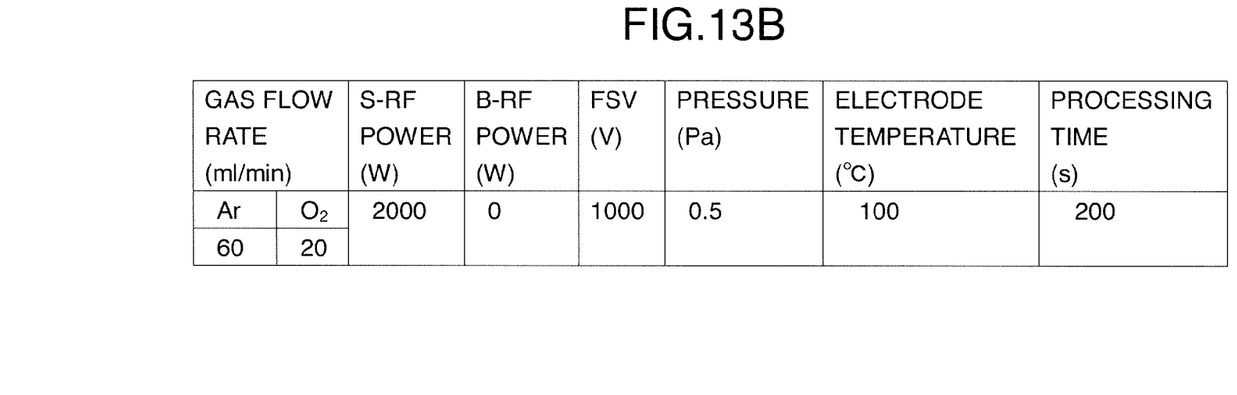

Since the inside of the plasma processing chamber is contaminated after the layer formation processing, the inside of the plasma processing chamber is plasma-cleaned again under the plasma cleaning conditions described in FIG. 13B and then the processing of devices such as next TMR element is performed. The mass production of devices such as TMR elements can be performed by such plasma processing flow, so that since the state in the plasma processing chamber can be maintained to be fixed every time and scattering in the etch profile for each device such as TMR element can be suppressed, the stability in mass production can be improved.

Further, according to the embodiment, efficiency of the manufacturing time in the manufacturing process of TMR elements and reduction in investment in plant and equipment can be attained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of processing a laminate including a magnetic layer by using a plasma processing apparatus including a processing chamber in which a sample is plasma-processed, a dielectric window to seal an upper part of the processing chamber hermetically, an inductive coupling antenna disposed above the dielectric window, a radio-frequency power source to supply radio-frequency electric power to the inductive coupling antenna and a Faraday shield disposed between the inductive coupling antenna and the dielectric window, the method comprising the steps of:
   plasma-etching the laminate while applying a first radio-frequency voltage to the Faraday shield to form a plasma-etched laminate, and
   forming a deposit layer on the plasma-etched laminate by plasma processing while applying a second radio-frequency voltage to the Faraday shield,
   wherein the second radio-frequency voltage is higher than the first radio-frequency voltage.

2. The plasma processing method according to claim 1, further comprising the step of:
   performing plasma cleaning in the processing chamber between termination of the plasma-etching of the laminate and the formation of the deposit layer on the plasma-etched laminate.

3. The plasma processing method according to claim 1, further comprising the step of:
   taking out the sample from the processing chamber and plasma-cleaning an inside of the processing chamber after the formation of the deposit layer on the plasma-etched laminate.

4. The plasma processing method according to claim 1, wherein the dielectric window is made of alumina.

\* \* \* \* \*